United States Patent [19]

Labriola

[11] 4,290,015
[45] Sep. 15, 1981

[54] ELECTRICAL VALIDATOR FOR A PRINTED CIRCUIT BOARD TEST FIXTURE AND A METHOD OF VALIDATION THEREOF

[75] Inventor: Donald J. Labriola, Troy, N.Y.

[73] Assignee: Fairchild Camera & Instrument Corp., Mountain View, Calif.

[21] Appl. No.: 86,220

[22] Filed: Oct. 18, 1979

[51] Int. Cl.³ .................. G01R 31/00; G01R 31/02
[52] U.S. Cl. .................. 324/158 R; 324/73 PC; 324/158 F
[58] Field of Search ............ 324/158 R, 158 F, 73 PC

[56] References Cited

U.S. PATENT DOCUMENTS 4,115,735  9/1978  Stanford ..................... 324/158 F Primary Examiner—Ernest F. Karlsen
Attorney, Agent, or Firm—Paul J. Winters; Ronald J. Meetin; Michael J. Pollock

[57] ABSTRACT

This invention relates to a structure for testing the integrity of a printed circuit board test fixture and to a method for implementing the verification of the fixture.

9 Claims, 3 Drawing Figures

ELECTRICAL VALIDATOR FOR A PRINTED CIRCUIT BOARD TEST FIXTURE AND A METHOD OF VALIDATION THEREOF

BACKGROUND OF THE INVENTION

1. Field of the Invention

This invention relates to test systems for checking the electrical interconnections between electrical components mounted on a printed circuit board and more specifically, to a structure and method for validating the proper functioning of a test fixture interfacing with the printed circuit board and test system.

2. Description of the Prior Art

Printed circuit board testers are well-known. Such testers are used to test the operability of a printed circuit board and each of the components associated with the board. Some test systems are designed to test printed circuit boards removed from the equipment with which they are designed to operate while other test systems are designed to test the circuit boards in place. Examples of printed circuit board test systems known to the prior art and with which the invention described herein will function are the in-circuit printed circuit board test systems designated by Model Nos. FF303 and FF101C and made by Fairchild Camera and Instrument Corporation (Fairchild).

SUMMARY OF THE INVENTION

This invention provides a structure for verifying the integrity of a printed circuit board test fixture (denoted often as a product access unit or "PAU"), which operates with the printed circuit board test system. The structure and method of this invention indicates the existence of problems with the test fixture such as poor probe contact with the printed circuit board, excessive wire resistance in the test fixture, poor board alignment, and bad pin-to-printed circuit board and pin-to-test system receiver connections, all the while using an authentic in-circuit test environment.

The PAU interfaces with a printed circuit board assembly by a so-called "bed of nails" matrix of contact probes. These contact probes are spring-loaded and are top pluggable into test probe receptacles which have been placed in a desired matrix pattern for the probes to contact the printed circuit board assembly at the desired locations once the printed circuit board is positioned correctly on top of the test fixture. If any contact probe does not make good electrical contact at the correct location for any reason, the test fixture cannot function properly. Each test probe receptacle of the matrix is electrically connected to one of a set of pins attached to the test fixture. A pin connector to the set of pins allows the test system to be in electrical contact with each contact probe.

The structure of this invention utilizes a test plate constructed from an unloaded printed circuit board (i.e., from a printed circuit board to which no components have been attached) etched and tooled by the manufacturer of the printed circuit board or by the party attaching components to the printed circuit board to the required specifications. The test plate is identical to the printed circuit boards to which eventually components will be attached to form an operating printed circuit board assembly for use in electrical equipment. These loaded boards are the boards to be tested by the PAU usually on the manufacturing line but often in the field where the finished printed circuit board is to be used.

The unloaded printed circuit board is, in one embodiment of this invention, wave-soldered on both sides to seal any openings or feed throughs. A conductive coating is then sprayed onto the upper surface of the printed circuit board shorting together all points on the board except for two preselected isolated solder pads formed in a nonconductive region on the surface of the board. These two electrically isolated solder pads are used as test points in the structure of this invention.

A specially constructed module having two selected resistors, one of a high value and the other of a low value, connected together at one end, is now attached to the top of the test plate. Typically this module is soldered to the test plate. The common end of the two resistors is hard wired to the conductive surface of the test plate and each of the two unconnected leads is respectively attached to one of the two isolated pads.

The remaining hardware associated with the structure of this invention comprises standard in-circuit test equipment, typically one of those test systems described previously with its interfacing product access unit.

In operation, the test plate is mounted on the PAU. The spring-loaded contact probes will contact the bottom surface of the test plate. If the contact probes are properly located in the desired matrix, each probe will contact a conductive feed through or the solder filling the feed through of the test plate. Thus each probe will be in electrical contact with the conductive coating on the top surface of the test plate and the resistance from the particular test pin associated with a contact probe to a preselected one of the two electrically isolated solder pads is measured by the test system. A similar measurement is made from each pin in the PAU to the pad. If a pin is improperly connected to a contact probe or the contact probe does not make good contact to the feed through or the solder filling the opening through the test plate for any reason, the value of the resistance measured by the test system will clearly be affected. A measurement performed for each test pin in supposed contact with the conductive surface of the test plate can easily detect any deviation from the expected value of the measurement. When the measurements have been made using the first selected resistor, a similar series of measurements are made using the second resistor. These measurements are made from a pin in the PAU through the conductive sheet on the test plate to the second isolated pad.

Another mode of operation is to set one of the isolated pads at a fixed voltage while holding the selected pin and associated contact probe at another fixed voltage. Voltage measurement of the conductive surface is made through the second isolated pad. Similar measurements are made for each pin in PAU to test that particular pin. Then a similar set of measurements are performed by reversing the roles of the contact pads, i.e., by setting the second isolated pad at a fixed voltage with the selected test pin at another fixed voltage and the voltage measurement performed through the first isolated pad. Measurements varying from expected values indicate a fault in the tested pin or associated contact probe of the PAU.

If desired, additional resistors or other impedance elements can be used for the purpose of conducting the tests.

DESCRIPTION OF THE PREFERRED EMBODIMENTS

Figure 1:
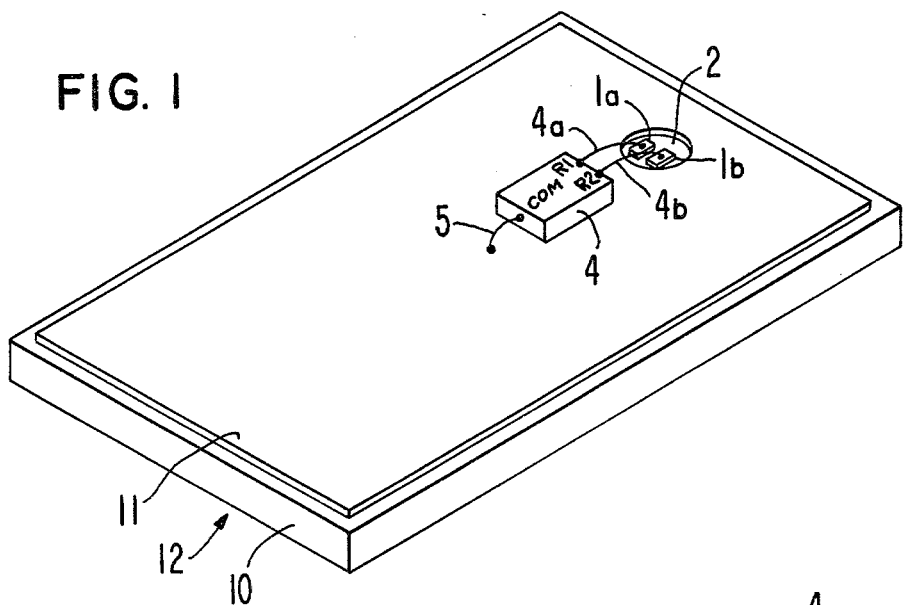
FIG. 1 illustrate schematically the structure of this invention with a printed circuit board together with two electrically isolated conductive pads connected to the impedance module.
Figure 3:
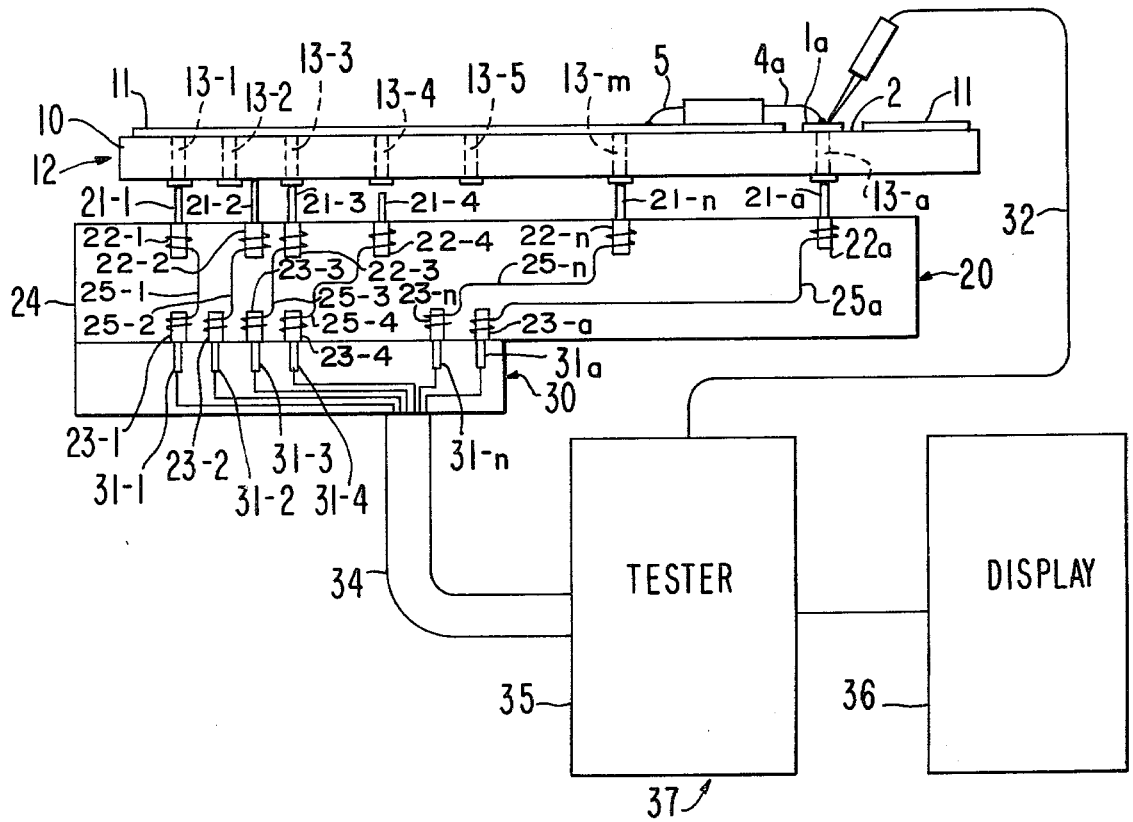
FIG. 3 shows the operation of this invention with a test system and test fixture.

FIG. 1 shows printed circuit board 10 which has formed a conductive sheet 11 over one surface. Attached to conductive sheet 11 is module 4. Lead 5 from module 4 and from resistors R1 and R2 is electrically attached to conductive sheet 11, typically by soldering. Leads 4a and 4b from module 4 and from resistors R1 and R2 respectively, are attached to conductive pads 1a and 1b respectively formed in the midst of nonconductive region 2. Electrically conductive pads 1a and 1b are electrically isolated from each other and the remainder of conductive sheet 11. Techniques for formation of a conductive layer 11 and conductive pads 1a and 1b on a printed circuit board are well-known and thus will not be described in detail. Also shown in FIG. 3 are the wave-soldered filled holes 13-1 through 13-m (also termed "lands" or "feed throughs") of the printed circuit board 10. The board 10, module 4, conductive sheet 11 and solder-filled feed throughs 13-1 to 13-m form test plate 12.

Figure 2:
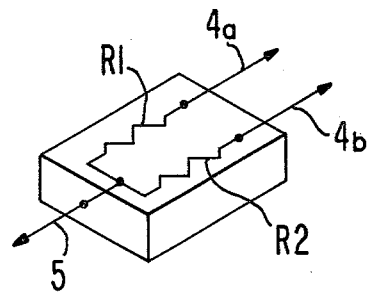
FIG. 2 shows schematically one possible module for use in accordance of this invention.

FIG. 2 shows in more detail module 4 of FIG. 1. Resistor R1, in one embodiment having a value of 10 ohms, and resistor R2, having a value of 1 meg ohms in this embodiment, are placed within module 4 with one end of each resistor joined together in connection with lead 5. The other end of lead 5 is electrically connected to sheet 11. The other end of resistor R1 is attached to lead 4a which is connected to a first isolated electrically conductive pad 1a. The other end of resistor R2 is connected to lead 4b which is connected to a second electrically isolated pad 1b (FIG. 1). Resistors R1 and R2 are typically encapsulated in an electrically insulating material such as epoxy with a plastic cover.

FIG. 3 illustrates schematically the operation of test plate 12 of this invention to determine the proper operation of test fixture 20. The bed of nails of PAU 20 is shown schematically and typically is of the type used in conjunction with test systems such as Model Nos. FF101C and FF303; a typical example of such a test fixture would be a Thinline (a registered trademark of Fairchild Vacuum Fixture System manufactured by Fairchild. Protruding from the top surface of test fixture 20 are spring-mounted contact probes 21-1 through 21-n. These contact probes 21-1 through 21-n correspondingly fit into probe receptacles 22-1 through 22-n which are located in a matrix in the text fixture body 24.

The receptacles 22-1 through 22-n are placed so that each of the probes 21-1 through 21-n will contact preselected ones of solder-filled feed throughs 13-1 through 13-m of the printed circuit board 10. Each probe receptacle 22-1 through 22-n is respectively put in electrical contact with a set of test pins 23-1 through 23-n by the conductive wires 25-1 through 25-n. The test pins 23-1 through 23-n are placed on the fixture body 24 so as to correspondingly match the mating pins 31 of pin socket 30. Through the pin connector 30 and cable 34, each pin and corresponding contact probe is electrically connected to a test system 37, the main part of which is represented schematically by tester 35.

In conducting a test, tester 35 (shown schematically) provides an electrical signal through cable 34 to each of the pins 23-1 through 23-n and corresponding probes 21-1 through 21-n in sequence. Assuming for illustrative purposes that the signal is transmitted through probe 21-1 from pin 23-1, the signal passes through the solder-filled feed through 13-1 and along the conductive sheet 11 (which has a very low impedance relative to the resistors R1 or R2 in module 4), through lead 5 and through a selected one of resistors R1 and R2. Assuming the current passes through resistor R1, lead 32 is attached to pad 1a to which is attached lead 4a from resistor R1. Accordingly, a signal is picked up on lead 32 which is brought back to tester 35. The impedance to the test signal from pin 23-1 to lead 32 is then measured by system tester 35 as indicated in a display 36. Display 36 can be any of a variety of mechanisms such as a cathode ray tube, a paper tape, or an electrical storage medium in conjunction with a computer printout. The signal is next routed to pin 23-2 and probe 21-2. However, because this probe is incorrectly placed in the PAU the probe 21-1 does not contact the feed through 13-2, the test system 37 will detect a substantially infinite impedance to this signal and record this impedance in display 36. The test signal is next routed to in sequence to probe 21-3 (which is determined to be in contact with feed through 13-3), 21-4 (which is determined not to be in contact with feed through 13-4 due to a broken spring) until probe 21-n is reached. This last probe is determined to be in electrical contact with sheet 11. A system operator then is able to determine from display 36 which pins and probes form complete electrical circuits with sheet 11 and which pins and probes do not to determine whether the test fixture 20 is properly functioning. For example, the presence of dirt between a probe and sheet 11 or some other defect resulting in several extra ohms of resistance in the fixture can be indicated by the use of resistor R1 in this low resistance, high current sequence of tests. Thus for any unexpected resistance down to small impedances in series between a test probe 21-i and feed through 13-i, display 36 will indicate the impedance and allow the operator to check that particular test pin 23-i and probe 21-i showing a higher impedance than expected. Furthermore, each test of a particular pin and probe will flag an improper connection between the pin and probe.

The tests continue with a second sequence through all n test pins 21-1 through 21-n by switching large resistor R2 in place of small resistor R1. This is done simply by contacting lead 32 to conductive pad 1b (FIG. 1). This sequence allows testing for unwanted open circuits in the circuit loop of pin 23-i, wires 25-i, test probe 21-i, feed through 13-i and conductive sheet 11. This high resistance, low current sequence prevents the open circuit defect from arcing over and escaping detection.

Another mode of operation is to set the lead 32 in contact with pad 1a at a high voltage and to set the test pin 23-1 and contact probe 21-1 at ground. Another lead 32a (not shown) from tester 35 is placed in contact with pad 1b. Lead 32a measures the resulting voltage of conductive surface 11 through resistor R2. If the pin 23-1, probe 21-1 and feed through 13-1 are in proper electrical contact, a low voltage reading will result. If there is an improper connection within the fixture or between the probe of the fixture 20 and the test plate 12, a high reading will result. Next pin 23-2 (probe 21-2) is tested. The sequence is continued until pin 23-n is tested. At this point a second sequence is started with lead 32 measuring and lead 32a set at the high voltage until all n pins and probes are tested.

A convenient way of elminating separate leads 32 and 32a (not shown) is to use two of the m feed throughs 13-1 through 13-m of printed circuit board 10. Conductive pads 1a and 1b are set over these two feed throughs and two contact probes 21 of the PAU will keep the pads in contact with tester 35. In FIG. 3, this alternate way of contacting pads 1a and 1b is shown. In place of lead 32, contact pad 1a is electrically connected to contact probe 21a through feed through 13a. The probe 21a is connected through receptacle 22a, wire 25a, test pin 23a and mating pin 31a to tester 35. Contact pad 2b is likewise connected but not explicitly shown in FIG. 3. With this set-up the pins and contact probes for pads 1a and 1b are tested first by measuring the known series impedance of R1 and R2 across contact pads 1a and 1b, respectively, before the other pins and probes are tested as described previously.

It will be apparent from the above description that this invention provides a simple and accurate way of simulating the operation of the test fixture in an actual working environment in such a way that defects in the operation of the test fixture can be readily determined.

The method and process of this invention has several advantages over prior test fixture validation structures and methods. The structure of this invention uses the very test system to conduct the actual tests in the finished product as the test apparatus. Thus, this test system exactly duplicates the conditions under which the test fixture must perform in actual operation at both the upper and lower limits of the system's measurement ranges. Resistors R1 and R2 are carefully selected to represent these upper and lower limits. Thus for the FF101C Test System, 10 ohms and 1 meg ohms yield currents of 100 mA and $10^{-7}$ A, with voltage drops across the resistors of 1 V and 0.1 V, respectively. These values are the upper and lower limits of the test system. The invention described above also eliminates development and production costs associated with test equipment other than that to be used in the actual manufacturing line.

The fixture tested is the actual fixture to be used in the manufacturing operation and no modifications of the fixture for testing are necessary, such as additional test points or contact probes which may not be easily or cheaply available. Thus production costs for the fixtures can be maintained at a consistent and predictable level. Moreover, any fixture suitable for use with a test system can be tested in accordance with the test plate of this invention.

The test process is extremely simple and inexpensive to operate and the test plate is inexpensive to produce and is capable of being produced in large scale manufacture. The test hardware can be built simultaneously with test fixture and, apart from a quick visual examination, requires almost no quality control input.

Since the test plate is manufactured from the printed circuit board to be used by the customer using the test system, the printed circuit board has been etched, drilled and tooled to specifications identical to those to be used in actual production operation of the test system for which the test fixture has been designed. Not only does this hold down production costs but eliminates any number of possible sources of error in testing of the test fixture that might arise if a special test board were manufactured for testing the test fixture.

Furthermore, by utilizing two separate groups of tests involving two resistors with a high and a low value respectively, the cause of any bad contact problem can be isolated. For example, if there is a failure in the high resistance tests, low current tests might indicate a problem with an oxidized coating on the surface of a contact probe since the lower voltage used cannot arc across such a coating. On the other hand, a failure in the low resistance tests might imply several ohms of extra resistance in series with a test pin due to dirty contacts, for example. In the second mode of operation the problem of the oxidized coating of a contact probe is indicated in the sequence of tests having contact pad 2b set at a high voltage by lead 32a and lead 32 measuring the voltage of the test plate 12 through contact pad 2a. In this sequence most of the voltage drop occurs across the large resistor R2, and the lowered voltage of the conductive coating surface and feed through cannot arc across such a coating. Likewise, a failure in the sequence of tests having contact pad 2a set at a high voltage and contact pad 2b for measurement implies several ohms of extra resistance in series.

The test plate and procedure described above in accordance with this invention are inexpensive and relatively fool proof and provides a novel and accurate means to monitor the performance of test fixtures for use with test systems.

What is claimed is:

1. A structure for validating the performance of a test fixture for a test system for printed circuit boards, the structure comprising:

a board having (1) an electrically conductive sheet on a first region of a surface of the board and (2) a plurality of electrically conductive pads on a second region of the surface, the pads electrically isolated from each other and from the sheet, the board having no transistors formed on it; and a test module having (1) a like plurality of first output leads corresponding on a one-to-one basis to the pads, each first lead attached to the corresponding pad, (2) a second output lead attached to the sheet, and (3) a like plurality of impedance elements corresponding on a one-to-one basis to the first leads, each impedance element connected between the second lead and the corresponding first lead.

2. A structure as in claim 1 wherein each impedance element is a resistor, the board having no capacitive or inductive elements formed on it.

3. A structure as in claim 2 wherein the resistance of one of the resistors is at the high resistance range of operation of the test system and the resistance of another of the resistors is at the low resistance range of operation of the test system.

4. A structure as in claim 3 wherein the board has holes therethrough filled with an electrically conductive material.

5. A structure as in claim 4 wherein each hole corresponds to a contact probe of the test fixture, the material in each hole placed in intended contact with the corresponding probe during test operation.

6. A structure as in claim 1, 2, 3, 4, or 5 wherein the plurality is two.

7. A method of validating a printed circuit board test fixture having contact probes to ensure proper operation of the test fixture comprising the steps of:

placing each probe in intended contact with a board having an electrically conductive sheet on a surface thereof but having no transistors formed thereon;

sequentially passing an electrical signal through each probe, the sheet, and a selected known impedance to measure the impedance to passage of the signal; and comparing the measured impedance to an expected impedance, thereby to provide an indication of whether the probe is properly conducting the signal.

8. A method as in claim 7 wherein the impedance measurement is made by a voltage reading of the sheet during the passage of the signal.

9. A method as in claim 8 wherein the board has a pair of electrically conductive pads connected through a pair of resistance elements, respectively, to the sheet, each pad electrically connectable to each probe through a corresponding conductively filled hole through the board, the known impedance selectively comprising each of the resistance elements.

* * * * *